United States Patent [19]

Walker et al.

[11] Patent Number: 4,667,108
[45] Date of Patent: May 19, 1987

[54] IMPEDANCE MATCHED AND THERMALLY COOLED DEFLECTION AMPLIFIERS FOR CHARGED PARTICLE BEAM APPARATUS EMPLOYING DEFLECTORS

[75] Inventors: David M. Walker, Westford; Alan P. Sliski, Lincoln, both of Mass.

[73] Assignee: Control Data Corporation, Minneapolis, Minn.

[21] Appl. No.: 749,790

[22] Filed: Jun. 28, 1985

[51] Int. Cl.[4] .......................................... H01J 37/302
[52] U.S. Cl. ............................. 250/396 R; 250/492.2; 250/398
[58] Field of Search ............... 250/396 R, 398, 492.2; 313/250, 257, 292, 325

[56] References Cited

U.S. PATENT DOCUMENTS 3,717,785  2/1973  Guernet ........................... 250/492.2
4,438,557  3/1984  Parker et al. ..................... 250/492.2

Primary Examiner—Bruce C. Anderson
Assistant Examiner—Jack I. Berman
Attorney, Agent, or Firm—Charles W. Helzer

[57] ABSTRACT

An improved deflection amplifier interconnection circuit structure for charged particle beam write/read apparatus having a deflector stage wherein the charged particle apparatus is mounted within an evacuated housing by a support member. Transmission line-type printed wiring conductor patterns are provided within the insulating support member which serves as a combined electrical and vacuum feed-thru structure. The transmission line-type printed wiring conductor pattern interconnects the output of a deflector drive amplifier to the deflector element of the charged particle beam apparatus within the evacuated housing. An improved impedance match between the deflector drive amplifier and the deflector element is obtained along with improved cooling capability for the amplifier and elimination of the need for mounting the amplifier within a separate housing remotely located from the evacuated housing for the charged particle apparatus.

12 Claims, 3 Drawing Figures

U.S. Patent
May 19, 1987
4,667,108
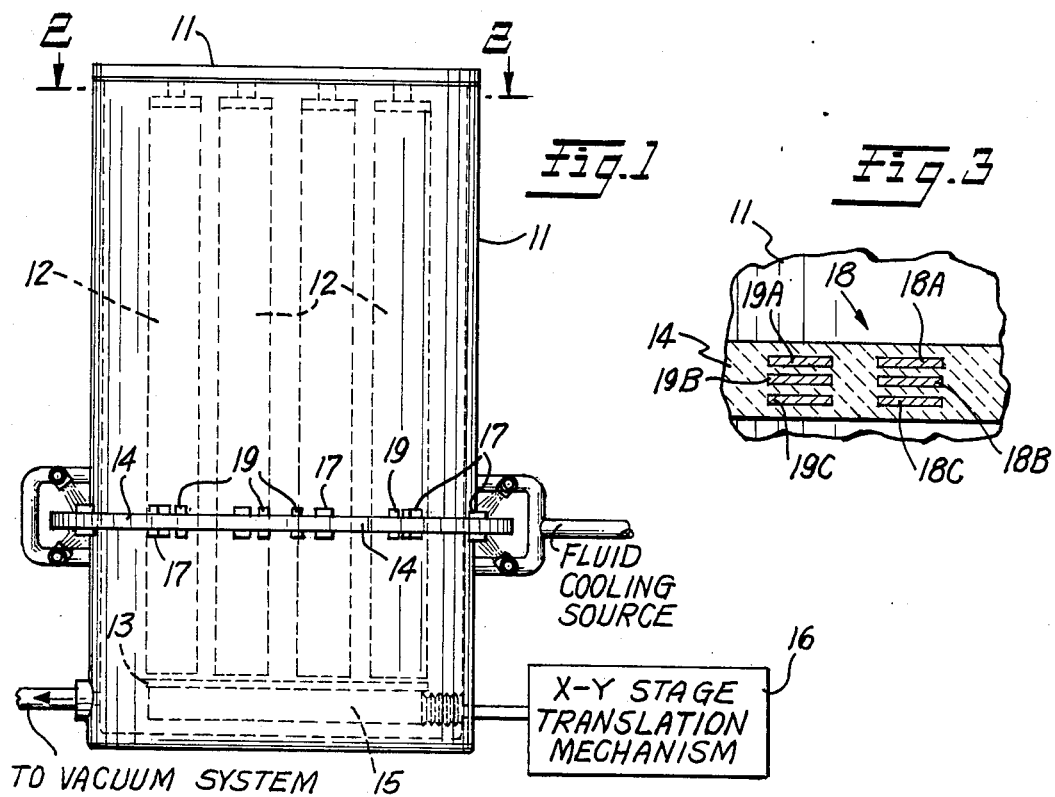
Fig.1
Fig.3
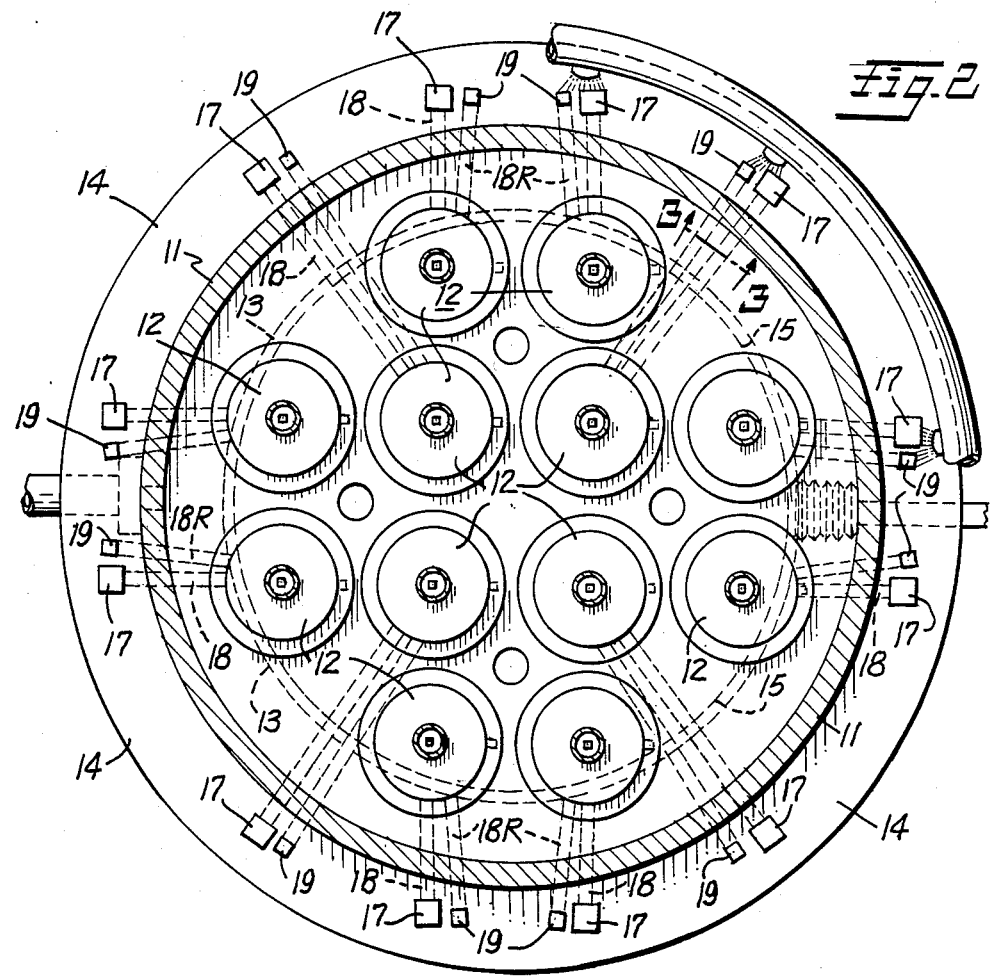
Fig.2

IMPEDANCE MATCHED AND THERMALLY COOLED DEFLECTION AMPLIFIERS FOR CHARGED PARTICLE BEAM APPARATUS EMPLOYING DEFLECTORS

TECHNICAL FIELD

This invention relates to improved charged particle beam write/read apparatus having at least one deflector stage for deflecting a charged particle beam, such as an electron beam, over discrete areas of a target surface and employing a novel deflection drive amplifier mounting and interconnection circuit arrangement.

More particularly, the invention relates to a transmission line-type printed wiring conductor pattern formed on a circuit board for mounting the electron beam optical column and for interconnecting the output of a deflector drive amplifier to the deflector element of an electron beam optical column. With this arrangement a greatly shortened circuit interconnection having an improved impedance match between the deflector drive amplifier and the deflector element is obtained and improved cooling of the deflector drive amplifier can be achieved to thereby improve efficiency and operating characteristics of the deflection system.

BACKGROUND PRIOR ART PROBLEM

Known electron beam write/read apparatus having at least a single deflector stage generally require that the deflection amplifiers be mounted in a separate housing removed from the evacuated housing for the charged particle beam apparatus. The remote location for the housing of the deflection amplifiers then require that transmission line conductors for the high frequency, high voltage deflection potential be interconnected between the remote housing of the deflection amplifier and the evacuated housing in which the charged particle beam apparatus is mounted. In addition, presently known vacuum housing electrical connection feed-thrus do not permit transmission line-type connection through the vacuum housing directly to the electron beam apparatus mounting column. Thus, presently known circuit connector vacuum feed-thrus from the high voltage deflection amplifier output to the high voltage electron-optical column deflector are not properly impedance matched and therefore result in poor circuit performance. The present invention was devised in order to overcome these problems.

SUMMARY OF INVENTION

It is therefore a primary object of the invention to provide an improved printed wiring conductor arrangement and vacuum housing mounting structure for mounting charged particle apparatus deflector element deflection drive amplifiers on the same evacuated housing support structure in which the charged particle beam apparatus deflector element is mounted to thereby obviate the need for transmitting high frequency, high voltage deflection signals to the deflectors from remotely located deflection drive amplifiers.

Another object of the invention is to locate the deflection drive amplifiers constructed as described in the preceeding paragraph in a location such that the drive amplifiers readily can be cooled.

A still further object of the invention is to provide an improved transmission line-type printed wire conductor interconnection circuit between the deflector elements of a charged particle beam apparatus and their respective drive amplifiers wherein a proper impedance match between the deflector drive amplifier and its respective deflector element is optimized to provide improved circuit operating characteristics and efficiency.

In practicing the invention, a charged particle beam write/read apparatus is mounted within an outer evacuated housing for maintaining the elements of the apparatus within a vacuum environment. The elements of the charged particle beam apparatus including at least one deflector element are suppported in operating position with respect to a target surface by an insulating support member that extends within the evacuated outer housing with its outer edge or rim portions extending outside of the evacuated housing. The evacuated housing is comprised by separable housing portions clamped to opposite sides of the insulating support member in a vacuum-tight manner through the medium of suitable vacuum sealing means such as O-rings. The insulating support member is formed from a plurality of ceramic layers having supply printed wiring conductor patterns formed on the mating inside surfaces thereof and co-fired to form an integral, hermetically sealed package. The package is provided with thru-layer vias formed on the ceramic layers before firing in order to transfer conductive connections from either outside surface to the interior of the package and vice versa whereby operating and control electrical potential can be supplied to the elements of the charged particle beam apparatus mounted within the evacuated housing. At least one power-rated deflector drive amplifier stage is provided for supplying drive current to the deflector elements of the charged particle beam apparatus. The deflector drive amplifier stage preferably is fabricated in hybrid integrated circuit form and mounted on the outside edge or rim of the insulating support member exteriorly of the evacuated housing. The insulating support member in the vicinity of the deflector drive amplifier has transmission line-type printed wiring conductor patterns formed therein for interconnecting the output from the deflector drive amplifier stage to the deflector element of the charged particle beam apparatus. The transmission line-type conductor printed wiring patterns thus provided are designed to improve the impedance match between the deflector drive amplifier stage output and the deflector element input. For this purpose, the transmission line-type printed wiring conductor patterns include return conductors from the deflector element to the exterior of the evacuated housing. A terminating impedance such as a large resistor is mounted on the outside edge of the insulating support member exteriorly of the evacuated housing and to which the return transmission line-type printed wiring conductors are connected. In preferred forms of the invention, suitable cooling means for providing a flow of cooling fluid to the deflector drive amplifier and/or the terminating impedance, particularly to the heat sinks of these devices.

BRIEF DESCRIPTION OF DRAWINGS

These and other objects, features and many of the attendant advantages of this invention will be appreciated more readily as the same becomes better understood from a reading of the following detailed description, when considered in connection with the accompanying drawings, wherein like parts in each of the several figures are identified by the same reference characters, and wherein:

FIG. 1 is a side plan view of a novel electron beam lithography system employing an electron-optical column having a deflector stage which is supplied with operating potential from a deflection drive amplifier mounted on an insulating support member supporting the electron-optical column and within which transmission like-type printed wiring conductor patterns are formed according to the invention for interconnecting the drive amplifier to the deflector element of the electron-optical column;

FIG. 2 is a top plan view of the electron beam lithography system shown in FIG. 1; and FIG. 3 is a partial cross-sectional view taken through plane 3—3 of FIG. 2, and illustrates a preferred form of construction of the transmission line-type printed wiring conductor pattern formed within the insulating support member used in the apparatus shown in FIGS. 1 and 2.

BEST MODE OF PRACTICING THE INVENTION

FIGS. 1 and 2 of the drawings show a charged particle (electron) beam lithography system for providing direct electron beam writing from a multi-channel compact cluster of individual electron beam optical columns simultaneously on a relatively small target semiconductor wafer upon which a plurality of identical semiconductor microcircuit chip patterns are to be written simultaneously. For a more detailed description of the construction of the electron beam lithography system shown in FIGS. 1 and 2, reference is made to copending U.S. application Ser. No. 749,792 entitled "Modular All-Electrostatic Electron-Optical Column and Assembly of Such Columns Into an Array and Method of Manufacture"—David M. Walker, Alan P. Sliski, Kenneth J. Harte and John J. Carrona, inventors, filed concurrently with this application and assigned to Control Data Corporation, the disclosure of which hereby is incorporated into this application in its entirety. Briefly, however, the system includes an outer, evacuated housing 11 within which a multi-channel assembly of individual electron beam optical columns 12 are mounted in a compact cluster The multiple electron-optical columns 12 are substantially identical in construction and operation as described more fully in the above-referenced copending application Ser. No. 749,792. The columns are supported over respective, relatively small target surface areas on a target semiconductor wafer 13 upon which a multiplicity of semiconductor microcircuit chip patterns are to be written simultaneously. The electron beam optical columns 12 are physically supported in precisely aligned axial and rotational orientation by means of an insulating support board member 14, to be described more fully hereafter, and the semiconductor target wafer 13 is supported on a movable stage member 15, under the control of a controllable x-y stage translation mechanism.

As noted above, the electron beam optical columns 12 all are of substantially identical construction and employ a number of modular component electrostatic deflectors, electrostatic lens and electrostatic aperture elements whose construction is standardized in the interest of simplicity and low cost and ease of assembly and alignment during manufacture. The electron-optical columns 12 are held in a compact array aligned both axially and in rotational orientation with respect to each other, and with respect to the surface of target 13 by the insulating board member 14. As best shown in FIG. 2, the insulating board member 14 (sometimes referred to as the "motherboard") has a plurality of openings formed therein which are circular in nature and have substantially the same inside diameter as the outside diameter of the respective columns 12 so as to provide an interference press fit for the columns. The openings also are provided with a slotted keyway to accommodate a complementary fitting, axially extending integrally formed key member on the lower ends of the columns 12. By fitting the axially extending key into the appropriate keyway formed in insulating support motherboard 14, proper rotational orientation is provided for the respective electron-optical columns 12 and their assembled modular lens, deflector and aperture elements.

As described more fully in the above-referenced U.S. application Ser. No. 749,792, electrical connections are made automatically by spring-biased, pogo-type connectos between the elements of the respective electron beam optical columns and printed wiring patterns formed on the outer housing of the respective electron beam optical columns. The printed wiring patterns on the respective columns mate with coacting, supply printed wiring patterns formed within the surface of the motherboard support member 14 and respective pogo-type, snap-acting switching connectors are provided for for interconnecting respective ones of the two sets of printed wiring conductor patterns. The two respective sets of printed wiring conductor patterns thus comprised and functioning are not illustrated in FIGS. 1 and 2 for convenience, but have been omitted in order to simplify the drawings and facilitate description of the present invention. These two sets of interacting, printed wiring conductor patterns (not shown) however, serve to provide supply electrical operating and control potential to the electron gun, lens and aperture element for each of the respective electron-optical columns 12.

With respect to the operating potential supplied to the deflector elements of the respective electron-optical columns 12, they are relatively high frequency, high voltage potentials that cannot be supplied effectively and efficiently over the preformed supply conductor wiring patterns described in the above-referenced copending U.S. application Ser. No. 749,792. For this purpose, the present invention was devised and comprises mounting the deflection drive amplifier shown at 17 in FIGS. 1 and 2 for the deflector elements of the respective electron-optical columns 12 on the outer, exposed rim or edge portion of the insulating board member exterior of the evacuated housing 11 within which electron beam optical columns 12 are mounted. In the arrangement shown in FIGS. 1 and 2, a separate deflector drive amplifier 17 is provided for the deflector element of each electron beam optical column 12; however, it is believed obvious to those skilled in the art that by employing somewhat larger, higher rated amplifiers a single amplifier may be employed to drive the deflector elements of two or more of the electron optical columns and therefore reduce the number of deflector amplifiers used for the assembly. It is preferred however to employ commercially available, hybrid integrated circuit operational amplifiers for the amplifier 17 which desirably have exposed heat sinks or some self-contained cooling system for keeping the operating temperatures of the amplifiers within prescribed operating limits.

Each of the deflector amplifiers 17 is separately mounted on the exterior rim portion of insulating support member 14 with its output connected to the input of the lens element of a respective electron-optical column 12 by means of an internally formed transmission line-type printed wiring conductor pattern shown in dotted outline at 18.

FIG. 3 is a fragmentary cross-sectional view of a portion of the insulating support member 14 taken through plane 3—3 of FIG. 2 and illustrates the nature of the construction of the transmission line-type printed wiring conductor pattern 18. In FIG. 3, it will be seen that the transmission line-type printed wiring conductor pattern 18 is comprised by four layers of insulation, preferably ceramic, having interspersed conductive layers 18A, 18B and 18C spaced apart from each other. The internal layers 18A, 18B and 18C comprise thick film printed conductive layers formed on the mating inside surfaces of the two exterior and two interior insulating layers which then are fired to form an hermetically sealed package having smooth outer surfaces. The thickness of the conductive layers 18A, 8B and 18C, their width, their linear extent in a direction transverse to the plane of the paper as shown in FIG. 3 and their spacing apart will determine the impedance and other operating characteristics of the resulting transmission line-type structure. These design parameters are adjusted to provide improved impedance matching between the output of the deflector drive amplifier 17 and the input of the respective deflector elements of the electron beam optical columns 12. The design of the respective optical column is such that the single stage deflector element thereof is axially positioned coextensively with the position of the insulating support board member 14 where spring-biased, pogo-type connectors mounted on their respective electron-optical columns can directly connect the supply operating potential from the printed wiring conductor pattern 18 to the deflector element without the need for further printed wire conductor runs on the exterior housing of the respective electron-optical column. By this expedient, the transmission line character of the interconnection between the deflector amplifier 17 output and the deflector element input is preserved.

In order to optimize the impedance match of the transmission line interconnection to the deflector elements of the respective electron-optical columns, each interconnection includes a return transmission line-like printed wiring conductor pattern 18R connected between the deflector element of the respective electron-optical columns 12 and an impedance matching resistor shown at 19 mounted on the exterior rim edge of the insulating support motherboard 14 outside of evacuated housing 11. The return transmission line-like printed wiring conductor pattern 18R is fabricated in precisely the same manner as shown in FIG. 3 of the drawings with the impedance matching resistors 19 being designed to optimize supply of operating potential to the deflector element. The deflector in effect is seen as a stub-connected parallel load along with the impedance matching resistor 9 when viewed from the output of the deflector amplifier 17. The interconnection is such that the operating potential is applied to the deflector element and the impedance matching load resistors 19 via the central printed wiring conductor 18B while the outer conductors 18A and 18C function a shielding conductors operated at system ground potential.

The multi-beam system operating characteristics and efficiency is further improved by providing forced cooling as shown at 21 to the respective deflector amplifiers 17 and their associated impedance matching resistor 19. The cooling fluid may comprise forced air from an air cooling or air conditioning system having individual nozzle outlets such as shown at 21, or otherwise. In the event that the respective deflector amplifier stages are provided with self-contained liquid cooling systems, then the cooling system outlets 21 could comprise respective inlets and outlets for a liquid cooling mediums back to a central liquid cooling installation for maintaining the drive amplifiers 17 within their prescribed operating temperature limits also could be employed. In the event that the drive amplifiers 17 and impedance matching resistors 19 are provided with exposed heat sink surfaces, it may be possible to obtain the required cooling without need for direct discharge of a cooling fluid over the devices themselves in the event that the overall assembly is operated within an adequately cooled or air conditioned room.

INDUSTRIAL APPLICABILITY

The invention makes available a novel insulating support member for supplying the high voltage, high frequency operating potential required for the deflector element of a multi-channel assembly of electron-optical columns having single stage deflectors and mounted within an evacuated housing. The novel insulating support member has transmission line-like printed wire conductor patterns formed thereon for the supply of the high voltage, high frequency electric operating potential with maximum efficiency by greatly improving impedance matched interconnection between the output of the deflector amplifier and the deflector elements which they supply.

While the specific embodiment of the invention described is designed for use with electron beams, it is believed obvious to those skilled in the art that the novel impedance matched and thermally cooled deflection amplifier interconnection beam herein provided readily can be employed for the construction of other charged particle beam forming and manipulation systems such as ion beam optical columns and arrays.

Having described one embodiment of a novel impedance matched and thermally cooled deflection amplifier system for charged particle beam apparatus employing deflectors constructed in accordance with the invention, it is believed obvious that other modifications and variations in the invention will be suggested to those skilled in the art in the light of the above teachings. It is therefore to be understood that changes may be made in the particular embodiment of the invention described which are within the full intended scope of the invention as defined by the appended claims.

What is claimed is:

1. A charged particle beam write/read apparatus mounted within an outer evacuated housing for maintaining the elements of the apparatus within a vacuum environment, the charged particle beam apparatus including at least one deflector element and being supported in operating position with respect to a target surface by an insulating support member within the evacuated outer housing with the outer edges of the insulating support member extending outside of the evacuated housing, the evacuated outer housing being comprised by separable housing portions clamped to opposite sides of the insulating support member in a vacuum-tight manner through the medium of suitable vacuum sealing means, the insulating support member being formed from a plurality of ceramic layers having supply printed wiring conductor patterns formed on the mating inside surfaces thereof and co-fired to form an integral hermetically-sealed package and being provided with thru-layer vias formed on the ceramic layers before firing to transfer conductive connections from either outside surface to the interior of the package and vice versa for the supply of operating and control electric potentials to the elements of the charged particle beam apparatus mounted within the evacuated housing, at least one power-rated deflector drive amplifier stage for supplying drive electric potentials to the deflector element of the charged particle beam apparatus, said deflector drive amplifier stage being fabricated in hybrid integrated circuit form and mounted on the outside edge of the insulating support member exteriorly of the evacuated outer housing, and said insulating support member having transmission line-type printed wiring conductor patterns formed therein for interconnecting the output from the deflector drive amplifier stage to the deflector element of the charged particle beam apparatus and with the transmission line-type conductor printed wiring patterns being designed to provide an improved impedance match between the deflector drive amplifier stage output and the deflector element input.

2. An apparatus according to claim 1 further including cooling means for providing a flow of cooling fluid to the deflector drive amplifier for cooling purposes.

3. An apparatus according to claim 2 wherein the deflector drive amplifier includes a heat sink to which the cooling fluid flow is provided.

4. An apparatus according to claim 1 wherein the deflector element is stub connected to the transmission line-type printed wiring conductor pattern and the pattern includes return transmission-type printed wiring conductors from the deflector element to the exterior of the evacuated housing, and terminating impedance means mounted on the outside edge of the insulating support member exteriorly of the evacuated outer housing to which the transmission line-type return printed wiring conductors are connected.

5. An apparatus according to claim 4 further including cooling means for providing a flow of cooling fluid to the deflector drive amplifier and terminating impedance means.

6. An apparatus according to claim 5 wherein the deflector drive amplifier and terminating impedance means include heat sinks to which the cooling fluid flow is provided.

7. An apparatus according to claim 4 wherein the terminating impedance means comprises either a discrete or thick film printed wiring resistor.

8. An apparatus according to claim 6 wherein the terminating impedance means comprises either a discrete or thick film printed wiring resistor.

9. An apparatus according to claim 1 wherein there are a plurality of different deflector elements for the charged particle beam apparatus to be supplied with operating potentials and a plurality of deflector drive amplifiers are provided for connection to respective deflector elements.

10. An apparatus according to claim 8 wherein there are a plurality of different deflector elements for the charged particle beam apparatus to be supplied with operating potentials and a plurality of deflector drive amplifiers are provided for connection to respective deflector elements.

11. An apparatus according to claim 1 wherein said transmission line-type printed wiring conductor pattern comprises a three conductor layer with each layer separated from the other by an intervening insulator layer, the width, thickness and length of the conductor together with the thickness of the intervening insulator layer between the conductors determining the impedance of the line and with the center conductor being connected to provide drive operating potentials to the deflector elements with the two outer conductor layers serving as shields and being maintained at system ground.

12. An apparatus according to claim 10 wherein said transmission line-type printed wiring conductor pattern comprises a three conductor layer with each layer separated from the other by an intervening insulator layer, the width, thickness and length of the conductor together with the thickness of the intervening insulator layer between the conductors determining the impedance of the line and with the center conductor being connected to provide drive operating potentials to the deflector elements with the two outer conductor layers serving as shields and being maintained at system ground.

* * * * *